(12) United States Patent
Coolbaugh et al.

(10) Patent No.: US 6,399,458 B1
(45) Date of Patent: Jun. 4, 2002

(54) OPTIMIZED REACHTHROUGH IMPLANT FOR SIMULTANEOUSLY FORMING AN MOS CAPACITOR

(75) Inventors: Douglas D. Coolbaugh; David L. Harame, both of Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/400,676

(22) Filed: Sep. 21, 1999

(51) Int. Cl.[7] .............................................. H01L 21/20
(52) U.S. Cl. ....................... 438/394; 438/510; 438/528; 438/530
(58) Field of Search ................................ 438/394, 510, 438/511, 514, 527, 528, 530

(56) References Cited

U.S. PATENT DOCUMENTS

| 4,898,839 | A |   | 2/1990  | Fujinuma et al. |
|-----------|---|---|---------|-----------------|
| 4,939,099 | A |   | 7/1990  | Seacrist et al. |
| 5,218,228 | A |   | 6/1993  | Williams et al. |
| 5,254,484 | A | * | 10/1993 | Hefner et al.   |
| 5,391,905 | A |   | 2/1995  | Yamazaki        |
| 5,414,291 | A |   | 5/1995  | Miwa et al.     |
| 5,576,237 | A |   | 11/1996 | Bergemont et al.|
| 5,641,692 | A |   | 6/1997  | Miwa et al.     |
| 5,661,066 | A |   | 8/1997  | Takemoto et al. |
| 5,736,776 | A |   | 4/1998  | Yamamoto et al. |
| 6,189,746 | B1| * | 1/2001  | Yu .............................. 438/305 |
| 6,184,112 | B1| * | 2/2001  | Maszara et al. ............ 438/528 |

\* cited by examiner

Primary Examiner—Tuan H. Nguyen
(74) Attorney, Agent, or Firm—Scully, Scott, Murphy & Presser; William D. Sabo

(57) ABSTRACT

A method of forming a diffusion region in a silicon substrate having low-resistance, acceptable defect density, reliability and process control comprising the steps of: (a) subjecting a silicon substrate to a first ion implantation step, said first ion implantation step being conducted under conditions such that a region of amorphized Si is formed in said silicon substrate; (b) subjecting said silicon substrate containing said region of amorphized Si to a second ion implantation step, said second ion implantation step being carried out by implanting a dopant ion into said silicon substrate under conditions such that the peak of implant of said dopant ion is within the region of amorphized Si; and (c) annealing said silicon substrate under conditions such that said region of amorphized Si is re-crystallized thereby forming a diffusion region in said silicon substrate is provided.

13 Claims, 4 Drawing Sheets

OPTIMIZED REACHTHROUGH IMPLANT FOR SIMULTANEOUSLY FORMING AN MOS CAPACITOR

FIELD OF THE INVENTION

The present invention relates to metal-on-silicon (MOS) structures, and more particularly, to MOS structures that contain a low-resistance diffusion region therein, said low-resistance diffusion region having acceptable defect density, reliability and process control.

BACKGROUND OF THE INVENTION

Bipolar transistors use a relatively highly doped layer in the collector region to reduce the collector resistance and to improve the device performance. This region is called the sub-collector, and it is formed below the other diffusion regions which compose the bipolar transistor. Moreover, it is necessary to form a relatively highly doped reachthrough diffusion under the collector contact which connects the sub-collector to the surface with a relatively low-resistance diffusion. This is well-known, standard bipolar transistor design.

It is also desirable to have a capacitor element available on the same die for use in circuit design, and to reuse as many processing steps as possible that are part of the normal process flow to fabricate the capacitor. One advantage of reusing processing steps to fabricate an MOS capacitor is lower cost. It is imperative that the processes used to fabricate an MOS capacitor provide the desired reliability, defect density necessary for the application, and be sufficiently controllable to yield consistent electrical characteristics from process to process.

In the prior art, the diffusion region can be prepared using two different processes. These prior art processes are illustrated in FIGS. 1 and 2. In these figures, reference numeral 10 represents a silicon substrate, 12 represents shallow trench isolation regions, 14 represents an oxide that is formed on the surface of substrate 10 prior to ion implantation, 16 represents a preamorphization region, and 18 represents a diffusion region.

Specifically, FIGS. 1a–b show a diffusion made from a low dose, very shallow antimony (Sb) implant (Sb concentration $1-2\times10^{14}$ atoms/cm$^2$; ion implant energy 45 KeV), followed by a low energy, high dose phosphorous (P) implant (P concentration $4-6\times10^{15}$ atoms/cm$^2$; ion implant energy 20 KeV). In this prior art process, the antimony preamorphizes the silicon substrate from the top surface to a peak depth of about 30 nm below the silicon surface. After implanting the diffusion into the silicon wafer, the wafer is annealed and the surface is re-crystallized. The preamorphization step eliminates defects in the Si after anneal. Because the implant is shallow, it was determined that the MOS capacitor oxide that was grown later over this diffusion region was unreliable. Furthermore, this prior art resulted in large variations in the oxide thickness of the oxide grown over this diffusion region due to large variations in surface dopant concentration. Moreover, this prior art technique produced wide variations in oxide thickness among different process runs indicating the silicon oxidation was extremely sensitive to small, normal process variations.

FIG. 2 illustrates a second implantation method that can be employed in the prior art to manufacture a diffusion region. This prior art process is similar to the one shown in FIGS. 1a–b above except that the low energy, low dose Sb implant is eliminated—that is, no preamorphization step is employed. Instead, a single relatively high energy, high dose phosphorous implant is employed. This prior art process corrected the unreliable oxide and variable oxide problems, but dislocations and stacking faults in the silicon are present with this technique after annealing.

In view of the above drawbacks with prior art processes of fabricating diffusion regions, there is a continued need to develop new and improved methods that are capable of forming diffusion regions that have an acceptable defect density, reliability and process control, yet have low-resistance.

SUMMARY OF THE INVENTION

One object of the present invention is to provide a method of fabricating a diffusion region having low-resistance (a sheet rho of less than approximately 50.0 ohm/sq.).

Another object of the present invention is to provide a method of fabricating a diffusion region which has acceptable defect density, reliability and process control.

A further object of the present invention is to provide a diffusion region which can be employed in MOS capacitors.

These and other objects and advantages can be obtained by employing the method of the present invention wherein the energy of the high dose dopant, e.g. phosphorous, implant step is selected to keep the peak of implant, Rp, within the amorphous region created by a previously conducted preamorphizing implant step. Specifically, the method of the present invention is used in forming a low-resistance diffusion region in a silicon substrate, said method comprising the steps of:

(a) subjecting a silicon substrate to a first ion implantation step, said first ion implantation step being conducted under conditions such that a region of amorphized Si is formed in said silicon substrate;

(b) subjecting said silicon substrate containing said region of amorphized Si to a second ion implantation step, said second ion implantation step being carried out by implanting a dopant ion into said silicon substrate under conditions such that the peak of implant of said dopant ion is within the region of amorphized Si; and (c) annealing said silicon substrate under conditions such that said region of amorphized Si is re-crystallized thereby forming a diffusion region in said silicon substrate.

It is noted that the method of the present invention provides diffusion regions that meet the following three criteria: (i) low-resistance; (ii) low Si defects formed during annealing of the implanted Si; and (iii) a reliable oxide region having a uniform thickness with a cross wafer uniformity of approximately ±5%. While prior art processes may satisfy one or even two of these properties, they do not satisfy all of them.

Another aspect of the present invention relates to a method of forming an MOS capacitor which contains the diffusion region of the present invention therein. Specifically, this aspect of the present invention comprises conducting steps (a)–(c) mentioned above and then conducting the following steps:

(d) forming a dielectric layer on said silicon substrate;

(e) forming a doped polysilicon layer on said dielectric layer; and (f) annealing the doped polysilicon layer to activate the same.

In addition to providing methods of fabrication, the present invention also is directed to structures that are obtained by those methods. In accordance with this aspect of the present invention, an MOS structure is provided which comprises a silicon substrate having a diffusion region formed therein, said diffusion region having a resistance of 50 ohm/sq. or less, and being formed at a depth of from about 500 Å or greater from the surface of said silicon substrate.

When used as an MOS capacitor, the MOS structure further includes a dielectric layer formed on said silicon substrate; and a layer of activated, doped polysilicon on said dielectric layer.

DETAILED DESCRIPTION OF THE PRESENT INVENTION

Figure 1A:
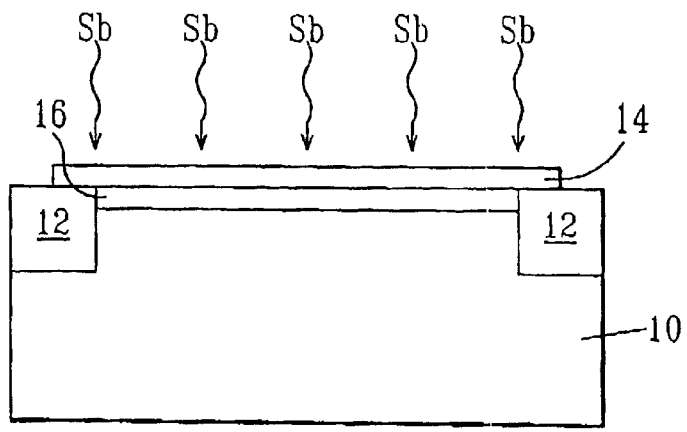
FIGS. 1a–1b are cross-sectional views illustrating a prior art method of fabricating a diffusion region in a silicon substrate; (a) Sb implantation; and (b) phosphorous implantation.

The present invention which provides MOS structures having a diffusion region formed therein will now be described in greater detail by referring to the drawings the accompany the present application. It is noted that in the accompanying drawings like and/or corresponding components are described by like reference numerals.

Figure 3A:
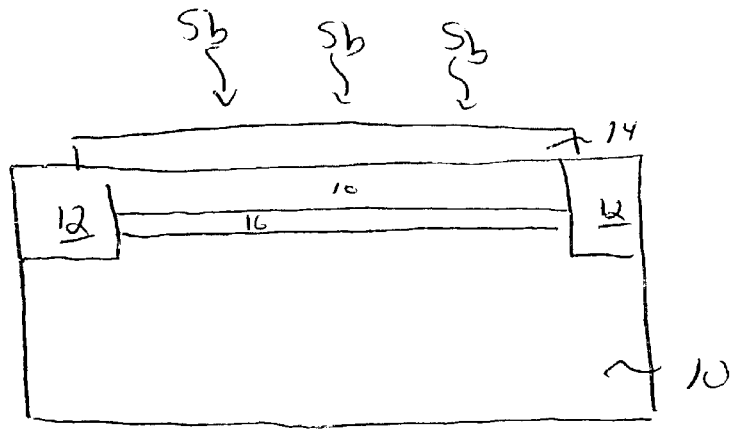
FIGS. 3a–3c are cross-sectional views illustrating the process used in forming the inventive diffusion region; (a) Sb implantation; (b) phosphorous implantation wherein the peak of the phosphorous implantation is within the preamorphization zone; and (c) after annealing.
Figure 3B:
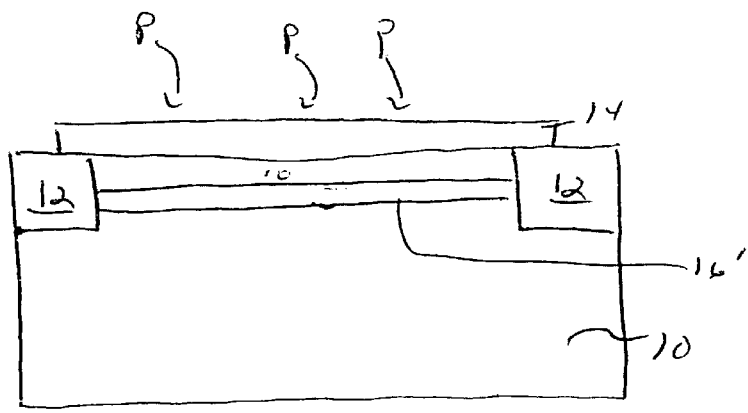
Figure 3C:
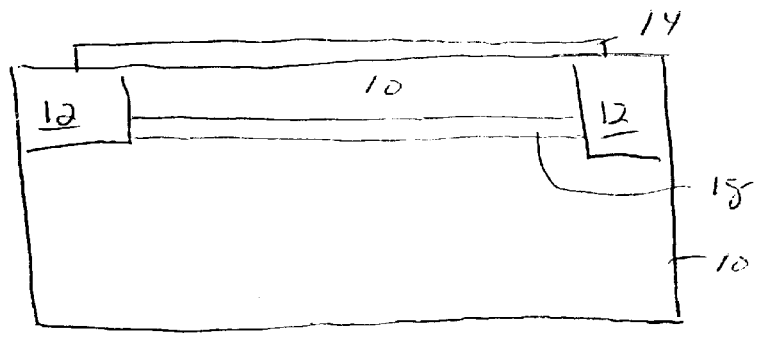

Reference is first made to FIGS. 3a–c which illustrate the basic processing steps that are employed in the present invention in fabricating a low-resistance diffusion region. Specifically, FIG. 3a illustrates the first implant step of the inventive process, i.e. a preamorphization step, wherein a region of amorphized Si 16 is formed in the surface of a silicon substrate 10. As shown, the silicon substrate 10 includes shallow trench isolation regions 12 and an oxide layer 14 which is formed on the surface of substrate 10, but not covering the shallow trench isolation (STI) regions. The oxide layer, e.g. $SiO_2$, is used as a mask during the various implantation steps and is removed from the surface of the structure before or after the re-crystallizing anneal step using conventional stripping techniques well known in the art.

Silicon substrate 10 includes any substrate that can be used in semiconductor manufacturing. Substrate 10 may be a Si wafer, Si chip, silicon-on-insulator (SOI) structure or other like structure and it may contain various isolation regions and active device regions therein. In the drawings, only shallow trench isolation regions are shown, nevertheless the present invention includes other silicon substrates that contain conventional isolation/active regions therein.

The structure shown in FIG. 3a is fabricated using conventional processes well known to those skilled in the art.

For example, STI regions 12 are fabricated using lithography and dry etching to provide a shallow trench region in the surface of silicon substrate 10. The shallow trench region is filled with a dielectric material such as tetraethylorthosilicate (TEOS) and densified. A liner material may optionally be formed in the trench prior to filling the trench with TEOS. The resist used in the lithography step is removed and thereafter the structure is planarized using conventional planarization processes such as reactive-ion etching (RIE), chemical-mechanical polishing (CMP) or grinding.

Oxide layer 14 is formed on the surface of substrate 10 by using a thermal oxidation process which is capable of growing a thin oxide layer on the surface thereof. In accordance with the present invention, the oxide is used as an implantation mask in a subsequent implantation process. Alternatively, the screen oxide layer can be formed by patterning the structure with a suitable resist and then depositing an oxide-containing material such as $SiO_2$ on the exposed surface of substrate 10 using conventional deposition techniques such as chemical vapor deposition (CVD), plasma-enhanced CVD, sputtering and other like deposition processes.

Notwithstanding which technique is employed in forming the oxide layer, oxide layer 14 has a final thickness of from about 20 to about 200 Å. More preferably, the final thickness of the oxide layer is from about 60 to about 100 Å.

As shown in FIG. 3a, the structure is subjected to a first ion implantation step wherein a heavy atom such as Ge, Sb, In, As or another dopant is employed to create a preamorphized region in the silicon substrate. Specifically, the first ion implantation step serves to break-up the crystal structure of the Si substrate in a region below the surface thereof creating a deep, amorphous implant region that contains amorphized Si. The first ion implant step employs an ion dose of from about $1\times10^{14}$ to about $5\times10^{14}$ atoms/cm$^2$ and the energy of the first ion implant step is greater than 50 KeV, preferably about 100 to about 500 KeV. Using these conditions, a preamorphized region is created at a depth of from about 80 to about 150 nm in the surface of the silicon substrate. It is noted that the heavy atom must be implanted at a depth which is sufficient to keep the top surface of the amorphous silicon region from the oxide layer.

A preferred heavy atom used in the first implant step is Sb and the preferred conditions are: Sb ion dose 1–$5\times10^{14}$ atoms/cm$^2$ and implant energy 200 KeV or greater. Using these conditions, Sb is implanted at a depth of from about 90 nm in the surface of the silicon substrate.

Next, as shown in FIG. 3b, a second ion implantation step is carried out on the structure shown in FIG. 3a. Specifically, the second ion implantation step implants a dopant atom such as P, As or another dopant using a high dosage thereof wherein the energy of the dopant implanted is chosen to keep the peak implant, also referred to as the range, Rp, within the amorphous region created by the first ion implant step. The dopant atom used in this step of the present invention is different from the heavy atom used in creating the region. The second ion implantation step is carried out using a dopant dosage of from about $1\times10^{15}$ to about $8\times10^{15}$ atoms/cm$^2$ and using an implant energy of from about 50 to about 150 KeV. It is again emphasized that the conditions used in the second ion implant step are sufficient to implant the dopant atom within the amorphization region created by the first ion implantation step, i.e. within a depth of from about 80 to about 150 nm from the surface of the silicon substrate. In FIG. 3b, 16' represents the new region wherein the dopant atom is implanted into the preamorphized region.

By implanting the dopant ion in the amorphous region created by the first ion implantation step, unwanted defect formation is avoided.

A preferred dopant used in the present invention is P and preferred conditions are: P dosage $4 \times 10^{15}$ atoms/cm$^2$ and implant energy 70 KeV. It is noted that the method of the present invention can employ any conventional ion implantation apparatus for the first and second implant steps.

After implanting the dopant ion into the amorphization region, the structure is then subjected to annealing under conditions that are sufficient to re-crystallize the amorphous Si thereby forming diffusion region 18. The structure after annealing is shown in FIG. 3c. Annealing may be carried out using a furnace anneal or rapid thermal annealing (RTA). Both of these annealing techniques are well known to those skilled in the art. Typically, this annealing step is carried out in an inert gas atmosphere, e.g. He, Ar and N$_2$, that may be mixed with less than about 3% oxygen. It is also possible to use an oxidizing ambient in place of an inert gas atmosphere during annealing.

The exact temperatures and times of annealing vary depending on the annealing technique used as well as the type of dopant found in the silicon substrate. The exact temperature and times are not critical to the present invention as long as they are capable or re-crystallizing the amorphous Si and activating the dopant.

Figure 4A:
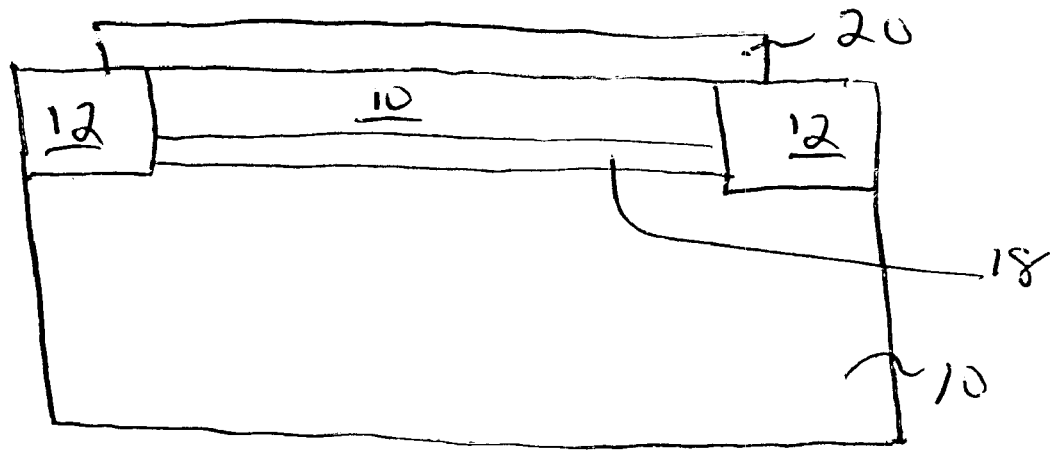
FIGS. 4a–4b are cross-sectional views showing the processing steps used in forming an MOS capacitor of the present invention; (a) forming the dielectric layer on the silicon substrate; and (b) forming the terminal of the capacitor.

Next, as shown in FIG. 4a, a dielectric layer 20 is formed on portions of the surface of the silicon substrate, covering some, but not all of the STI regions. The dielectric layer may be thermally grown using conventional thermal oxidation conditions well known in the art, or it can be deposited by conventional techniques such as CVD, plasma-enhanced CVD, sputtering, spin-on coating and other like deposition techniques. Suitable dielectric materials that can be employed in the present invention are typical insulating materials including, but not limited to: oxides, nitrides, diamond, diamond-like carbon, paralyene polymers, silicon polymers and other like materials. In a preferred embodiment of the present invention, the dielectric layer is a thermally grown oxide layer. The thickness of dielectric layer 20 is typically of from about 30 to about 200 Å. More preferably, the thickness of dielectric layer 20 is from about 50 to about 100 Å.

Figure 4B:
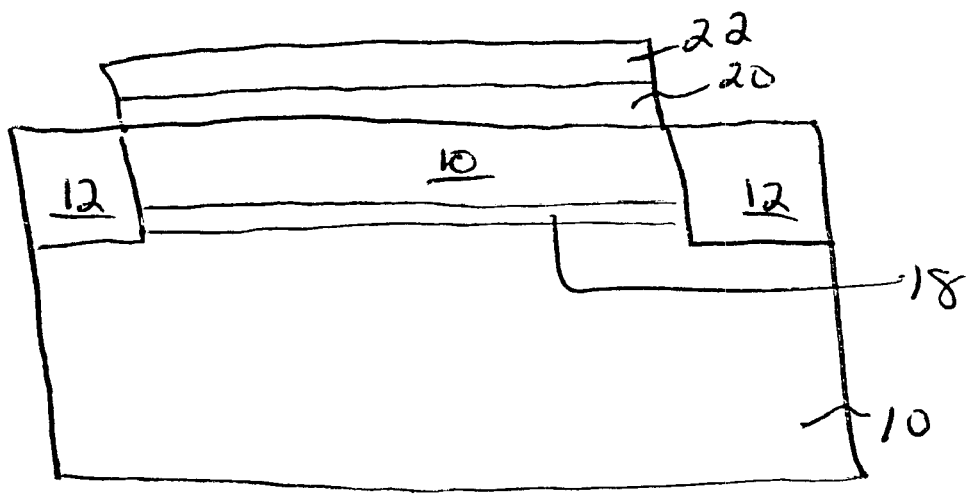

A layer of doped or undoped polysilicon 22 is then formed on the entire structure shown in FIG. 4a and the polysilicon layer and dielectric layer are patterned forming the structure shown in FIG. 4b. The polysilicon layer is formed using conventional deposition techniques well known to those skilled in the art. For example, chemical vapor deposition, plasma-assisted chemical vapor deposition or sputtering may be used to form the polysilicon layer on the surface of dielectric layer 12. A highly preferred means for depositing the polysilicon layer is by the pyrolysis of a silane at low temperatures such as between 600° to 750° C. The thickness of the polysilicon layer, which is not critical to the present invention, is typically of from about 500 to about 3000 Å. Patterning may be carried out using conventional lithography and reactive-ion etching.

As stated above, the doping of the polysilicon may be performed during the deposition process or after the polysilicon layer has been formed. When doping is carried during the deposition process, the deposition gas includes a n- or p-type dopant, i.e. diborane. When doping is carried out after formation of the polysilicon layer, the dopant atoms are introduced by conventional ion implantation. Notwithstanding which of these techniques is employed, the doped polysilicon layer contains a dopant concentration of from about $1 \times 10^{14}$ to about $1 \times 10^{21}$ atoms/cm$^2$. A convention anneal may follow the formation of the doped polysilicon layer which is sufficient to homogenize the distribution of dopant atoms throughout the entire polysilicon layer, raise the concentration of dopant atoms in the silicon grains to at or near the solubility limit, and to re-crystallize the silicon film causing the formation of grain boundaries in the polysilicon layer. This annealing step is carried out using conventional furnace anneals or rapid thermal annealing. Again, the exact temperatures and time may vary depending on the type of dopant atoms incorporated into the polysilicon layer as well as the type of annealing process chosen.

Figure 1B:
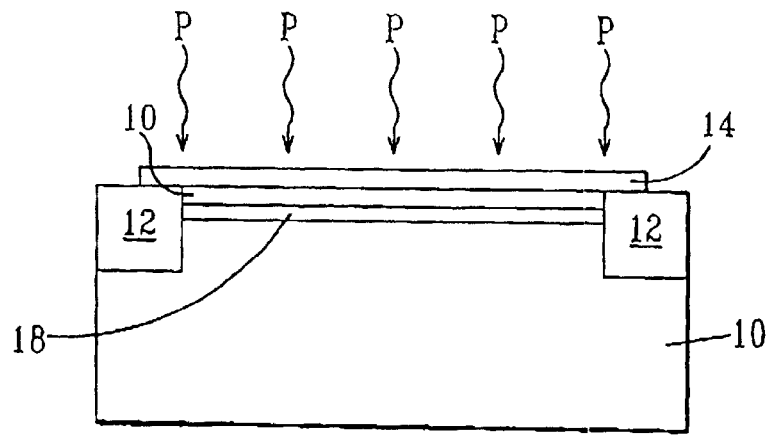
Figure 2:
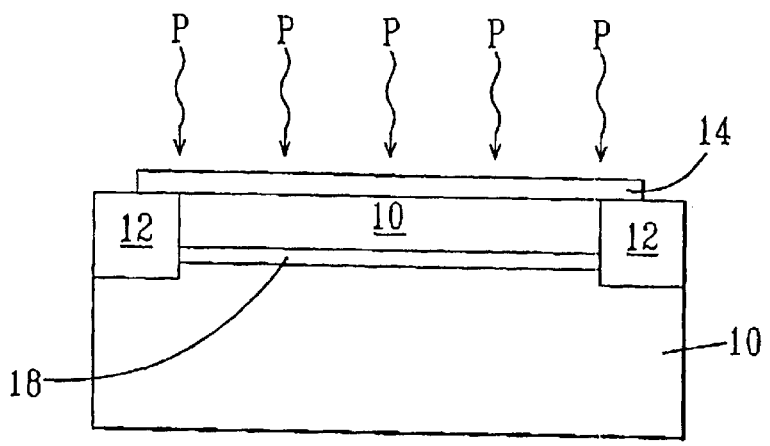
FIG. 2 is a cross-sectional view of a prior art method of fabricating a diffusion region in a silicon substrate using only phosphorous implantation.
Figure 5:
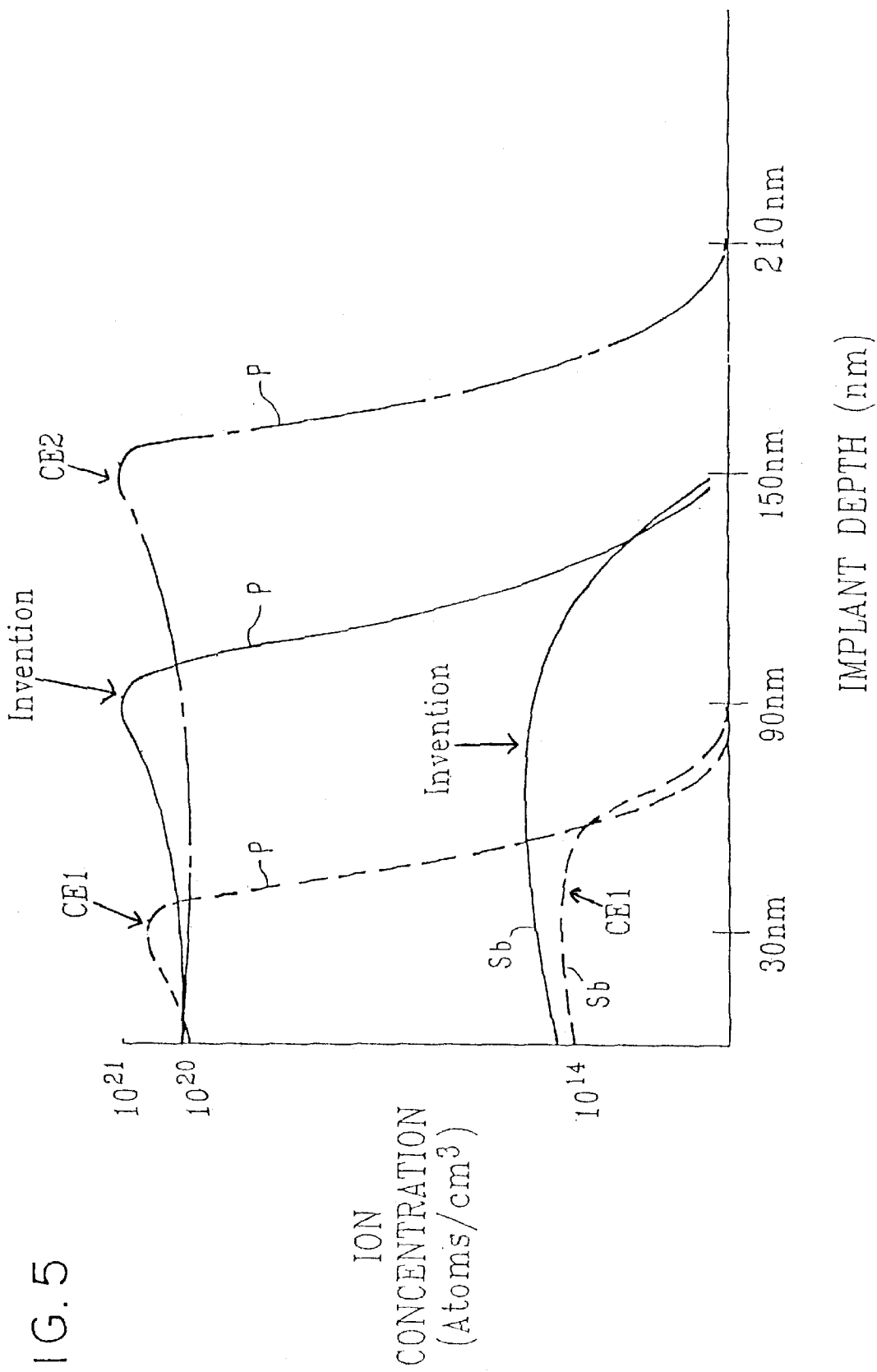
FIG. 5 is a graph of implant profiles including diffusion regions formed using prior art processes and a diffusion region prepared by the present invention.

Attention is now made to FIG. 5 which is a graph of dopant ion concentration (y-axis) vs. implant depth (x-axis). The graph provides a comparison of final diffusion dopant profiles using prior art processes CE1 and CE2 and the method of the present invention. It is noted that CE1 represents the method shown in prior art FIGS. 1a–b and CE2 represents the method shown in prior art FIG. 2.

While this invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms described and illustrated, but fall within the scope of the appended claims.

Having thus described our invention in detail, what we claim as new, and desire to secure by the Letters Patent is:

1. A method of forming a diffusion region in a silicon substrate, said method comprising the steps of:

(a) subjecting a silicon substrate to a first ion implantation step, said first ion implantation step is carried out at an ion dose of from about $1 \times 10^{14}$ to about $5 \times 10^{14}$ atoms/cm$^2$ and an energy of 50 KeV or greater such that a region of amorphized Si is formed in said silicon substrate, said region of amorphized Si is formed at a depth of from about 80 to about 150 nm below the surface of the silicon substrate;

(b) subjecting said silicon substrate containing said region of amorphized Si to a second ion implantation step, said second ion implantation step is carried out by implanting a dopant ion into said silicon substrate under conditions such that the peak of implant of said dopant ion is within the region of amorphized Si; and (c) annealing said silicon substrate under conditions such that said region of amorphized Si is re-crystallized thereby forming a diffusion region in said silicon substrate.

2. The method of claim 1 wherein said silicon substrate further includes shallow trench isolation regions embedded therein and an oxide layer formed on said silicon substrate, said oxide layer not covering all of said shallow trench isolation regions.

3. The method of claim 2 wherein said oxide layer is removed prior to or after said annealing step.

4. The method of claim 1 wherein said first ion implantation step employs the use of a heavy atom selected from the group consisting of Ge, Sb, In, As and other dopants that are capable of providing said region of amorphized Si.

5. The method of claim 4 wherein said heavy atom is Sb.

6. The method of claim 1 wherein Sb is employed in the first ion implantation step at a dosage of about $1-5 \times 10^{14}$ atoms/cm$^2$ and said Sb implantation is carried out at an energy of 200 KeV or greater.

7. The method of claim 1 wherein said second ion implantation step employs a dopant atom selected from the group consisting of P, As and other dopants.

8. The method of claim 7 wherein said dopant atom is P.

9. The method of claim 1 wherein said second ion implantation step employs a dopant dosage of from about $1\times10^{15}$ to about $8\times10^{15}$ atoms/cm$^2$ and an energy of from about 50 to about 150 KeV.

10. The method of claim 1 wherein P is employed in said second ion implantation step at a dosage of $4\times10^{15}$ atoms/cm$^2$ and said second ion implantation step is carried out at an energy of 70 KeV.

11. The method of claim 1 wherein said annealing step includes a furnace anneal or a rapid thermal anneal.

12. The method of claim 1 wherein said annealing step is carried out in an inert gas atmosphere that may be optionally mixed with less than about 3% oxygen.

13. The method of claim 1 further comprising:

(d) forming a dielectric layer on said silicon substrate;

(e) forming a doped polysilicon layer on said dielectric layer; and (f) annealing the doped polysilicon layer to activate the same.

* * * * *